(12) United States Patent
Jin et al.

(10) Patent No.: US 7,955,074 B2
(45) Date of Patent: Jun. 7, 2011

(54) APPARATUS AND METHOD FOR THERMALLY TREATING SEMICONDUCTOR DEVICE CAPABLE OF PREVENTING WAFER FROM WARPING

(75) Inventors: Seung Woo Jin, Icheon-si (KR);
Kyoung Bong Rouh, Goyang-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 563 days.

(21) Appl. No.: 11/965,500

(22) Filed: Dec. 27, 2007

(65) Prior Publication Data
US 2008/0299784 A1 Dec. 4, 2008

(30) Foreign Application Priority Data

May 28, 2007 (KR) .................. 10-2007-0051528

(51) Int. Cl.
*F27D 1/00* (2006.01)
(52) U.S. Cl. ...................... 432/247; 432/251
(58) Field of Classification Search .......... 432/24, 432/247, 200, 205, 251
See application file for complete search history.

(56) References Cited

U.S. PATENT DOCUMENTS

| | | | |
|---|---|---|---|
| 5,926,742 A | 7/1999 | Thakur et al. | |
| 6,090,210 A * | 7/2000 | Ballance et al. | 118/725 |
| 6,612,590 B2 * | 9/2003 | Coomer et al. | 279/158 |
| 6,739,944 B2 * | 5/2004 | Sandhu et al. | 451/5 |
| 6,744,018 B2 * | 6/2004 | Takano | 219/390 |
| 6,761,771 B2 * | 7/2004 | Satoh et al. | 118/725 |
| 6,769,908 B2 * | 8/2004 | Kawase | 432/77 |
| 6,798,137 B2 | 9/2004 | Ishida | |
| 6,869,266 B2 * | 3/2005 | Coomer et al. | 414/627 |
| 6,887,803 B2 * | 5/2005 | Yoo | 438/795 |
| 7,171,743 B2 | 2/2007 | Ishida | |
| 7,410,355 B2 * | 8/2008 | Granneman et al. | 432/5 |
| 2006/0027318 A1 * | 2/2006 | Hashizume et al. | 156/285 |

FOREIGN PATENT DOCUMENTS

JP H10-121253 5/1998
KR 10-2001-0091250 A 10/2001
* cited by examiner

*Primary Examiner* — Gregory A Wilson
(74) *Attorney, Agent, or Firm* — Kilpatrick Townsend & Stockton LLP

(57) ABSTRACT

A thermal treatment apparatus and method for processing a wafer are provided. The thermal treatment apparatus includes a process chamber for thermally treating the wafer, a heating unit for heating the wafer in the process chamber, and a gas supply unit for supplying a gas and controlling a gas pressure differently by sections of the wafer. The heating unit is provided in at least one of the upper side and the lower side of the process chamber. The heating unit includes a plurality of heater blocks capable of controlling a temperature for sections of the wafer.

2 Claims, 2 Drawing Sheets

APPARATUS AND METHOD FOR THERMALLY TREATING SEMICONDUCTOR DEVICE CAPABLE OF PREVENTING WAFER FROM WARPING

CROSS-REFERENCES TO RELATED APPLICATIONS

The present application claims priority to Korean application number 10-2007-0051528, filed on May 28, 2007, which is incorporated by reference in its entirety.

BACKGROUND OF THE INVENTION

The present invention relates to an apparatus and a method for fabricating a semiconductor device; and more particularly, to a thermal treatment apparatus capable of preventing a wafer from warping and a thermal treatment method using the apparatus.

In the process of fabricating a semiconductor device, thermal treatment is essential. Thermal treatment is used in the process of fabricating a semiconductor device for various reasons. For example, in case of oxidizing a silicon wafer, making it into a silicon oxide film ($SiO_2$) and using it as an insulation layer, an etching mask or a gate oxide film of a transistor, thermal treatment is used for an annealing process of thin films and a reflow process for planarizing flowable films like a Boro-Phospho Silicate Glass (BPSG) film. Also, thermal treatment is used for an alloy process of an ohmic contact, an annealing process for curing ion implantation damage and activation of ion-implanted impurities.

The apparatus for performing such a thermal treatment is a horizontal or vertical furnace. Recently, a rapid thermal treatment approach is now being used to reduce the entire thermal budget of the fabricating process as the semiconductor devices become highly integrated. The rapid thermal treatment approach, which achieves the desirable effect by using a high temperature for a short time, is much used in semiconductor fabricating process since it can perform most of the various processes which are performed in the furnace and have the merit of minimizing the side effect of impurities being spread on a wafer.

Several methods for further increasing the operating speed of a semiconductor device along with making the device small are suggested and practiced. Among them, a method of forming a metal wiring layer into multi-layers is suggested, and a triple-metal stack structure is much used recently. As the height of a metal wiring layer increases as such, the stress inflicted on a thin film stacked at the lower side increases. Due to the accumulated stress, a wafer warps. This phenomenon has been raised as a serious problem.

The warpage of the wafer frequently occurs during a series of processes of forming a pattern on a bare wafer in an early state and depositing a thin film thereon. That is, the warpage of a wafer occurs due to the partial difference in pattern density in the process of fabricating a device or the difference in deposited film thickness and the accumulation of stress between the deposited films. Also, as the metal wiring structure has been changed to the triple-metal stack structure for the improvement of scaling down and operating speed of a semiconductor device, this phenomenon has become severe.

If the warpage of the wafer occurs, defocus is induced in the photolithography process for forming patterns on the wafer. If this becomes severe, a chuck which fixes a wafer cannot fix a wafer any more so that the process can't further proceed. It is especially true when highly integrated semiconductor devices have line width of less than 80 nm. Although experiments including changes of the film stress are being made to improve this matter, none of them has reached a satisfactory level.

SUMMARY OF THE INVENTION

The present invention provides a thermal treatment apparatus capable of preventing a wafer from warping and a thermal treatment method using the apparatus.

In one embodiment, a thermal treatment apparatus for processing a wafer comprises a process chamber for thermally treating the wafer, a heating unit for heating the wafer in the process chamber, and a gas supply unit for supplying a gas and controlling a gas pressure differently by sections of the wafer. The heating unit is provided in at least one of the upper side and the lower side of the process chamber. The heating unit includes a plurality of heater blocks capable of controlling a temperature by sections of the wafer. The gas supply unit includes a main gas supply pipe and a plurality of gas inlets which are branched from the main gas supply pipe and supply a gas into the process chamber. Each of the gas inlets includes a mass flow controller (MFC) to control a flow rate of the gas injected into the process chamber. The thermal treatment apparatus further comprises a sensing device in the process chamber to measure an extent and a direction of a warpage of the wafer. Also, the thermal treatment apparatus further comprises a wafer loading unit for loading and unloading the wafer in the process chamber and a gas exhaust unit for exhausting the gases supplied into the process chamber.

In another embodiment, a method for thermally treating a wafer includes loading a wafer to be thermally treated into a process chamber, raising a temperature of the process chamber and injecting a reactant gas into the process chamber wherein the reactant gas is controlled by sections of the wafer according to an extent and a direction of a warpage of the wafer when the reactant gas is injected into the process chamber. The injecting of the reactant gas into the process chamber makes a flow rate of the gas large in an opposite direction of a warpage of the wafer. The injecting of the reactant gas into the process chamber adjusts the flow rate of the reactant gas by sensing the extent of the warpage of the wafer. The injecting of the reactant gas into the process chamber makes the flow rate of gas larger on a section of the wafer with severe warping. The method further includes sensing the extent and direction of the warpage of the wafer after the loading of the wafer into the process chamber. The temperature of the wafer is controlled differently by sections of the wafer according to the extent of the warpage of the wafer. The processing chamber adjusts the temperature of the process chamber in a range of 150 to 1,200° C.

DESCRIPTION OF SPECIFIC EMBODIMENTS

Figure 1:
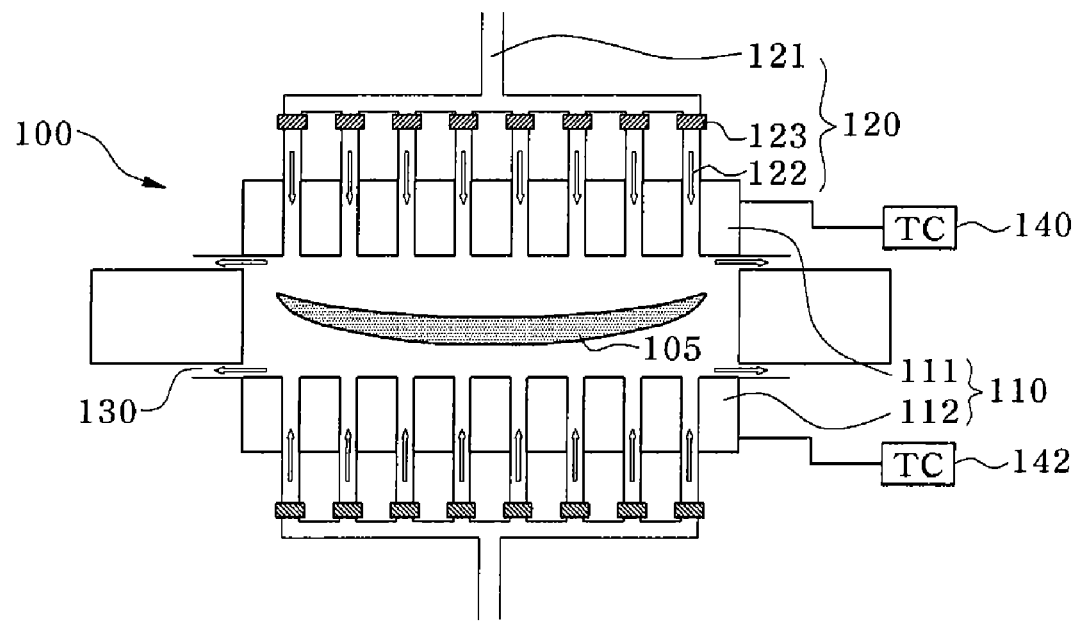
FIG. 1 is a schematic view showing a thermal treatment apparatus according to one embodiment of the present invention.

FIG. 1 is a schematic view which shows a thermal treatment apparatus where a wafer warped upwardly is loaded according to one embodiment of the present invention.

In one embodiment, a thermal treatment apparatus may include a process chamber 100 providing a space for thermally treating a wafer 105, a heating unit 110 having a plurality of heater blocks 111 and 112 to provide a predetermined temperature for the wafer 105 loaded in the process chamber 100, a gas supply unit 120 having a plurality of gas inlets 122 for supplying a reactant gas and a purge gas to the wafer 105 loaded in the process chamber, and a gas exhaust unit (not shown) having a plurality of gas outlets 130 for exhausting the reactant gas and the purge gas supplied to the process chamber in which the wafer 105 is loaded. Although not shown in FIG. 1, a wafer loading unit is established in the process chamber 100 for loading or unloading a wafer which undergoes the thermal treatment.

As shown in FIG. 1, the heating unit 110 includes a plurality of heater blocks 111 and 112 provided to the process chamber 100. The heating unit 110 can control the temperature of the wafer 105 in a range of 150 to 1,200° C. according to circumstances. Although the heater blocks 111 and 112 can be established at both an upper side and a lower side, they can also be established only at one of the upper side and the lower side. Also, each heater block can control the temperature individually for a section of the wafer since the heater block has a separate temperature controlling means 140, 142 to control temperature. The temperature controlled by the heating unit 110 is changed in a range of 20 to 900° C. per second.

The gas supply unit 120 includes a main gas supply pipe 121 and the plurality of the gas inlets 122 which are branched from the main gas supply pipe 121 and supply gas to the process chamber 100. The gas supply unit 120 can be arranged at both the upper and lower portions of the process chamber 100 to supply gas to the upper and lower sides of the wafer 105 as shown in FIG. 1. A gas such as a nitrogen gas ($N_2$), an oxygen gas ($O_2$), a helium gas (He) or an argon gas (Ar) can be used as the supply gas from the gas supply unit 120. Between the main gas supply pipe 121 and each gas inlet 122 of the gas supply unit 120, a mass flow controller (MFC) 123 to control the flow rate of the gas, which is injected into the process chamber 100, can be provided. If the mass flow controllers 123 are established in each gas inlet 122 as shown in FIG. 1, the flow rate of the gas injected on the wafer 105 within the process chamber 100 can be controlled by sections of the wafer 105 through the separately controlled flow rate of the gas from each gas inlet 122. Therefore, the warpage of the wafer 105 can be improved by controlling the flow rate of the injected gas according to the extent and direction of warpage.

The gas exhaust unit includes a plurality of gas outlets 130 for exhausting the reactant gas and the purge gas supplied to the process chamber 100. The wafer loading unit (not shown), for example, can absorb the wafer by using electrostatic power applied to the inner portion of the process chamber 100.

If the wafer 105 is loaded into the inner portion of the process chamber 100, a gas is injected through the gas inlets 122 which is provided at the lower side of the process chamber 100. At this time, the wafer floats as the gas is injected at a predetermined pressure. Thermal treatment such as an annealing process is done through the convection current of gas as the upper and lower sides of the process chamber 100 including heater blocks move toward the wafer 105. It is possible to adjust the space between the wafer 105 and the gas inlets 122 up to 150 μm.

Figure 2:
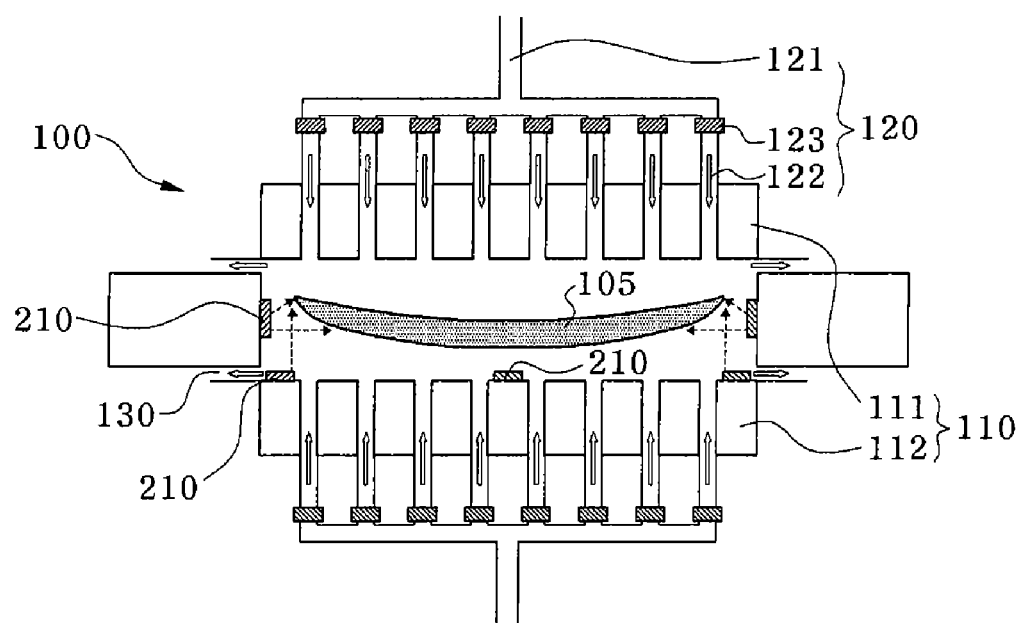
FIG. 2 is a schematic view showing a thermal treatment apparatus according to another embodiment of the present invention.

FIG. 2 is a schematic view illustrating the thermal treatment apparatus according to another embodiment of the present invention. Elements designated with the same reference numerals in FIG. 2 are similar to the element designated with that reference numerals in FIG. 1.

In the process chamber 100 which is capable of preventing the wafer from warping through the thermal treatment, a sensing device sensing the extent and direction of warpage, namely, a sensor 210 is additionally included. Then, as the process can be performed along with the observation of the extent of warpage, the thermal treatment and the wafer warpage preventing process can be more easily carried out. Also, the trouble of putting out the wafer from the chamber during the process, observing the extent of the prevention of warpage, and then loading the wafer into the inner portion of the chamber again can be avoided. Further, the treatment time of the wafer 105 can be shortened.

As will be well appreciated, several conventional sensors for example a sensor 210 as illustrated in FIG. 2, may be used for sensing the warpage of the wafer. As shown in FIG. 2, the sensor 210 can be provided at the lower sides or the lateral sides of the process chamber 100. For example, the extent of the warpage of the wafer can be measured by illuminating the ray of light to a predetermined point of the wafer and then calculating a time difference between the reflected light by sections of the wafer. In one embodiment, the extent of the warpage of the wafer can be measured by establishing a light emitting device and a light receiving device in a row, examining the ray of light passing through the wafer, and confirming whether the examined ray of light passes or calculating the time when the ray of light is reflected back. Additionally, if various sensing devices measuring the extent or direction of the warpage of the wafer can be adopted, the warpage preventing effect of the illustrated and described embodiments can be more advanced.

Figure 3:
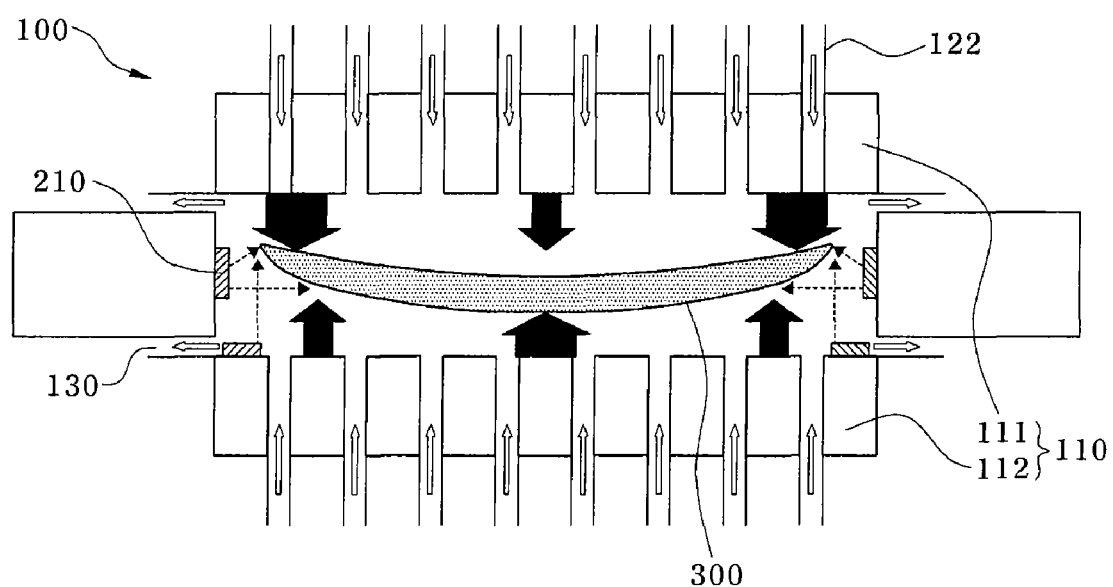
FIG. 3 is a view illustrating a method of thermally treating a semiconductor wafer using a thermal treatment apparatus of the present invention.

FIG. 3 is a schematic view illustrating a method of thermally treating a semiconductor wafer using the thermal treatment apparatus of the present invention. Elements designated with the same reference numerals in FIG. 3 are similar to the element designated with that reference numerals in FIGS. 1 and 2.

If the wafer 300 to be annealed is loaded into the process chamber 100, a gas is injected in a uniform flow rate through the gas inlets 122 which is provided at the lower side of the process chamber 100. The wafer 300 can be a substrate which is to be thermally treated for annealing to cure an ion implantation damage or activation of implanted impurities. Also, it can be a wafer of which the warpage should be prevented because of the difficulty in performing the thermal treatment due to the warpage or high reliability. Further, an inert gas, such as any one of nitrogen ($N_2$), oxygen ($O_2$), helium (He), argon (Ar) and a mixture gas thereof, which does not affect the film stacked on the wafer or the impurities injected in the wafer, can be used for the gas injected into the process chamber.

After the wafer 300 is loaded in the process chamber 100 and before it supplies a gas, the direction and extent of the warpage of the wafer can be measured through the sensor 210 provided to the process chamber 100.

If the extent of warpage of the wafer 300 is measured through the sensor 210, the gas is injected from the lower side of the wafer 300 at a predetermined pressure, and the wafer 300 floats by such a pressure. Then, in order to carry out the thermal treatment, the heating unit 110 having the heater blocks 111 and 112 moves toward the wafer 300 with the gas injection from the gas inlets 122 at the upper and lower sides of the process chamber. It is possible to adjust the space between the wafer 300 and the gas inlets 122 up to 150 μm.

When the space between the wafer 300 and the gas inlets 122 becomes narrow, the pressure of gas reaching the wafer 300 increases such that the mechanical force to be applied to the opposite direction of the warpage of the wafer, namely, to the back side of the wafer as shown in FIG. 3, increases. The warpage of the wafer 300 is improved with the additional thermal stress from the heater blocks 111 and 112.

When the flow rates of the gases injected from the gas inlets 122 are adjusted differently by sections of the wafer, the wafer warpage prevention effect can be more advanced. That is, as indicated by the arrows in FIG. 3, in case that the wafer 300 is warped upwardly, the flow rate of gas injected into an edge of the wafer from the gas inlets at the upper side of the wafer is increased while the flow rate of gas injected into a central portion of the wafer is decreased. Likewise, the flow rate of gas injected into the edge of the wafer from the gas inlets at the lower side is reduced while the flow rate of gas injected into the central portion of the wafer is increased. Thus, the gas pressure inflicted from the upside to the downside on the edge of the wafer becomes bigger than that on the central portion of the wafer and the gas pressure inflicted from the downside to the upside on the central portion of the wafer becomes bigger than that on the edge portion of the wafer. Due to different gas pressures inflicted on a different portion of the wafer, the warpage of the wafer can be effectively improved in fast time.

As will be well appreciated, the thermal treatment can be adjusted properly in a range of 150 to 1,200° C. according to the purpose of thermal treatment and the thermal treatment time can be adjusted properly in a range of 1 second to 10 minutes.

As mentioned above, according to the wafer thermal treatment apparatus and the thermal treatment method using the apparatus in the described embodiments, any suitable thermal treatment can be performed via the thermal treatment apparatus as long as the thermal treatment apparatus is capable of adjusting the flow rate of gas for each section of the wafer and thus the warpage of a wafer can be prevented. Therefore, difficulties in the photolithography process, for example defocus in the photolithography process due to the warpage of a wafer, can be solved. The device reliability and process reliability is also improved.

The embodiments of the present invention have been disclosed above for illustrative purpose. Those skilled in the art will appreciate that various modifications, additions and substitutions are possible, without departing from the scope and spirit of the invention as disclosed in the accompanying claims.

What is claimed is:

1. A method for thermally treating a wafer comprising:
    loading a wafer to be thermally treated into a process chamber, wherein a plurality of sections are defined on the wafer;
    raising a temperature of the process chamber; and
    injecting a gas into the process chamber, wherein the amount of the gas injected is adjusted for a section of the wafer according to an extent and a direction of a warpage of the wafer,
    wherein the temperature of the wafer is controlled independently for each section of the wafer according to the extent of the warpage of the wafer.

2. The method of claim 1, wherein the temperature of a first section of the wafer is set to higher than the temperature of a second section of the wafer and wherein the extent of the warpage of the first section of the wafer is severer than that of the second section of the wafer.

* * * * *